United States Patent
Zeng et al.

(10) Patent No.: US 9,018,535 B2
(45) Date of Patent: Apr. 28, 2015

(54) TOUCH PANEL AND METHOD FOR MANUFACTURING A TOUCH SENSOR LAYER OF THE TOUCH PANEL

(75) Inventors: Guang-Yi Zeng, Changhua County (TW); Liang-Hao Kang, Taipei County (TW); Yi-Cheng Tsai, Taoyuan County (TW)

(73) Assignee: Chunghwa Picture Tubes, Ltd., Padeh, Taoyuan (TW)

( * ) Notice: Subject to any disclaimer, the term of this patent is extended or adjusted under 35 U.S.C. 154(b) by 238 days.

(21) Appl. No.: 13/612,478

(22) Filed: Sep. 12, 2012

(65) Prior Publication Data

US 2013/0256008 A1      Oct. 3, 2013

(30) Foreign Application Priority Data

Mar. 30, 2012   (TW) .............................. 101111279 A

(51) Int. Cl.
*H05K 1/09* (2006.01)
*G06F 3/044* (2006.01)
*H01H 11/00* (2006.01)

(52) U.S. Cl.
CPC .............. *H01H 11/00* (2013.01); *G06F 3/044* (2013.01); *G06F 2203/04103* (2013.01); *G06F 2203/04111* (2013.01); *Y10T 29/49105* (2015.01)

(58) Field of Classification Search
USPC .......... 174/257, 254, 261; 345/100, 173, 174, 345/206; 349/12, 39, 44, 139; 338/13; 257/43, 79, 428
See application file for complete search history.

(56) References Cited

U.S. PATENT DOCUMENTS

| | | | |
|---|---|---|---|
| 2004/0141130 A1* | 7/2004 | Kawata et al. | 349/139 |
| 2005/0088596 A1* | 4/2005 | Shimizu et al. | 349/139 |
| 2005/0199889 A1* | 9/2005 | Kawata et al. | 257/79 |
| 2005/0285988 A1* | 12/2005 | Nakagawa | 349/44 |
| 2007/0058102 A1* | 3/2007 | Shimizu et al. | 349/44 |
| 2008/0062112 A1* | 3/2008 | Umezaki | 345/100 |
| 2008/0284931 A1* | 11/2008 | Kimura | 349/39 |
| 2009/0009455 A1* | 1/2009 | Kimura | 345/89 |
| 2010/0079425 A1* | 4/2010 | Yamazaki et al. | 345/206 |
| 2010/0139955 A1 | 6/2010 | Long et al. | |
| 2010/0265198 A1* | 10/2010 | Kondoh et al. | 345/173 |
| 2011/0006301 A1* | 1/2011 | Yamazaki et al. | 257/43 |
| 2011/0128114 A1* | 6/2011 | Kimura et al. | 338/13 |
| 2011/0192636 A1* | 8/2011 | Yau et al. | 174/254 |
| 2011/0193793 A1* | 8/2011 | An et al. | 345/173 |
| 2011/0193801 A1* | 8/2011 | Jung et al. | 345/173 |
| 2011/0290547 A1* | 12/2011 | Chen et al. | 174/261 |
| 2013/0009905 A1* | 1/2013 | Castillo et al. | 345/174 |
| 2014/0022467 A1* | 1/2014 | Chai et al. | 349/12 |

FOREIGN PATENT DOCUMENTS

TW       200914960 A       4/2009

* cited by examiner

*Primary Examiner* — Xiaoliang Chen
(74) *Attorney, Agent, or Firm* — Muncy, Geissler, Olds & Lowe, P.C.

(57) ABSTRACT

A touch panel includes a touch sensor layer including a first transparent electrode and a second transparent electrode, wherein an arrangement direction of the first transparent electrode can be perpendicular to that of the second transparent electrode, and both of the first and second transparent electrodes include two transparent metallic patterns which are stacked and electrically connected to each other.

19 Claims, 10 Drawing Sheets

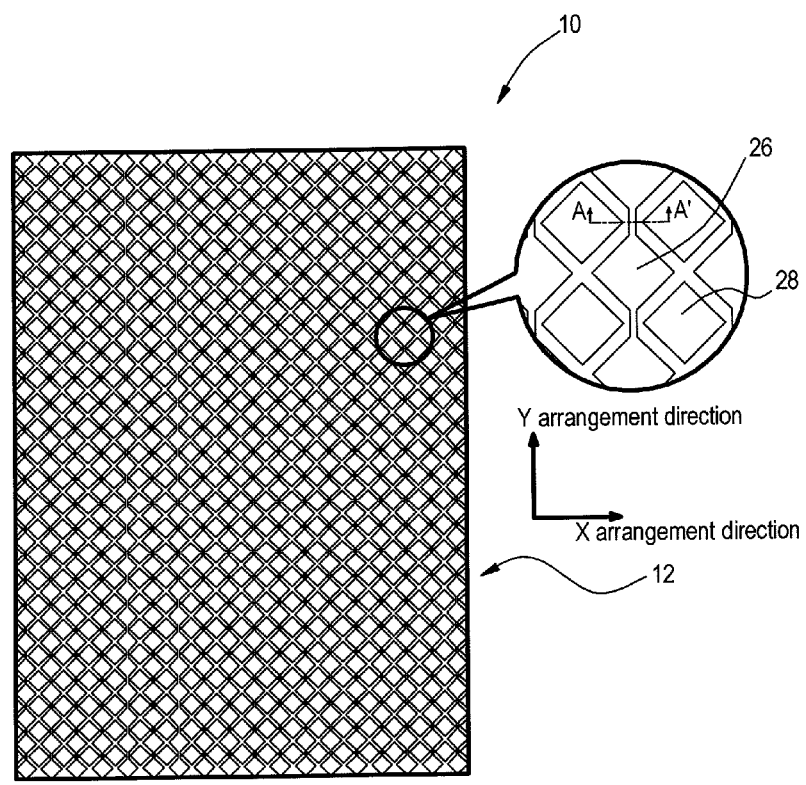
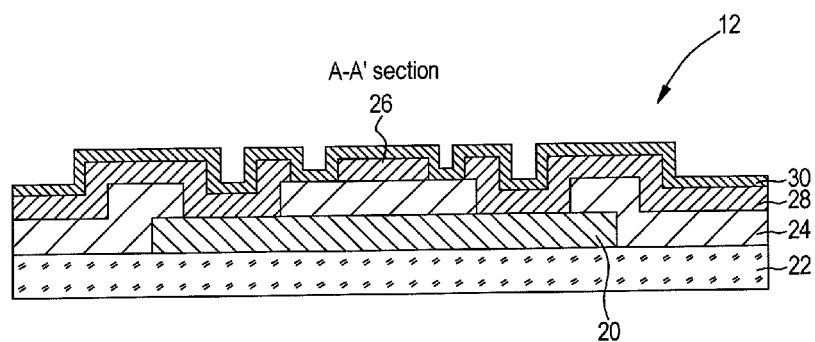
FIG. 1
(PRIOR ART)
FIG. 2
(PRIOR ART)

(19) United States
TOUCH PANEL AND METHOD FOR MANUFACTURING A TOUCH SENSOR LAYER OF THE TOUCH PANEL

CROSS-REFERENCE TO RELATED APPLICATION

This application claims the benefit of Taiwan Patent Application No. 101111279, filed on Mar. 30, 2012, which is hereby incorporated by reference for all purposes as if fully set forth herein.

BACKGROUND OF THE INVENTION

1. Field of Invention

This invention relates to a touch panel and a method for manufacturing a touch sensor layer of the touch panel, and more particularly to a touch panel and a method for manufacturing a touch sensor layer of the touch panel, wherein transparent electrodes of the touch sensor layer include two transparent metallic patterns which are stacked and electrically connected to each other.

2. Related Art

Recently, the technology of a touch panel is developed quickly. For example, resistance type touch panel, capacitance type touch panel, sound wave type touch panel and optics type touch panel have been widely applied to communication products, computer devices and consumptive electronic products so as to further increase the efficiency and convenience of the applied electronic product.

Referring FIG. 1, it depicts a conventional touch panel 10 includes a touch sensor layer 12 constituted by transparently conductive wires which are disposed longitudinally and transversely, crossed and separated from each other. The touch panel detects an inference of an electric field of the transparently conductive wires generated by a finger, and then reads a sensing signal generated from the longitudinally and transversely transparently conductive wires so as to determine a touch position.

Since transparently conductive materials of transparently conductive wires of the current touch panel are amorphous indium tin oxide (ITO), the patterned ITO is formed by the etching of an oxalic acid during a patterning process (e.g. photolithography and etching process). If the film thickness of the ITO is too thick, the ITO possibly becomes a poly-ITO during a film forming process (e.g. sputtering process). When the poly-ITO is etched by the oxalic acid, some ITO can be still staying. The stayed ITO must be etched by an aqua regia (e.g. nitric acid plus hydrochloric acid). The ITO is restricted by the patterning process, and thus the film thickness of the ITO cannot be too thick.

FIG. 2 is a cross-sectional schematic view of transparent electrodes (X and Y wires along X and Y arrangement directions) of a conventional touch sensor layer. A metal connecting wire 20 is disposed on a transparent substrate 22. An insulating layer 24 is disposed on the metal connecting wire 20 and the transparent substrate 22, and exposes a part of the metal connecting wire 20. A transparent electrode 26 along X arrangement direction and a transparent electrode 28 along Y arrangement direction are disposed on the insulating layer 24, and the transparent electrode 26 along X arrangement direction is electrically connected to the exposed part of the metal connecting wire 20. A protective layer 30 covers an exposed part of the insulating layer 24, the transparent electrode 26 along X arrangement direction and the transparent electrode 28 along Y arrangement direction. However, the transparent electrode 26 along X arrangement direction and the transparent electrode 28 along Y arrangement direction are restricted by the fact that the film thickness of the ITO cannot be too thick, and thus the transparent electrode of the touch sensor layer along X and Y arrangement directions have higher resistance.

Accordingly, there exists a need for a touch panel capable of solving the above-mentioned problems.

SUMMARY OF THE INVENTION

The present invention provides a touch panel including a touch sensor layer. The touch sensor layer includes a first transparent electrode and a second transparent electrode. The first transparent electrode includes a first transparent metallic pattern and a second transparent metallic pattern, wherein the second transparent metallic pattern is stacked and electrically connected to the first transparent metallic pattern. The second transparent electrode includes a third transparent metallic pattern and a fourth transparent metallic pattern, wherein the fourth transparent metallic pattern is stacked and electrically connected to the third transparent metallic pattern. The first transparent metallic pattern and the third transparent metallic pattern are made of the same material in the same manufacturing process, and the second transparent metallic pattern and the fourth transparent metallic pattern are made of the same material in the same manufacturing process.

The present invention utilizes the structure of two layers of transparent metallic pattern to solve the problem that the film thickness of the amorphous ITO of the conventional touch panel cannot be too thick. Furthermore, the structure of two layers of transparent metallic patterns of the present invention can decrease the resistance of the whole transparent electrode. In addition, the present invention utilizes the film thickness of transparent metallic patterns to adjust the color shift of the touch panel.

In order to make the aforementioned and other objectives, features and advantages of the present invention comprehensible, embodiments are described in detail below with reference to the accompanying drawings.

BRIEF DESCRIPTION OF THE DRAWINGS

FIG. 1 is a plan schematic view of a conventional touch sensor layer;

FIG. 2 is a cross-sectional schematic view of a conventional touch sensor layer;

The present invention will become more fully understood from the detailed description given herein below for illustration only, and thus are not limitative of the present invention, and wherein:

DETAILED DESCRIPTION OF THE INVENTION

Figure 3:
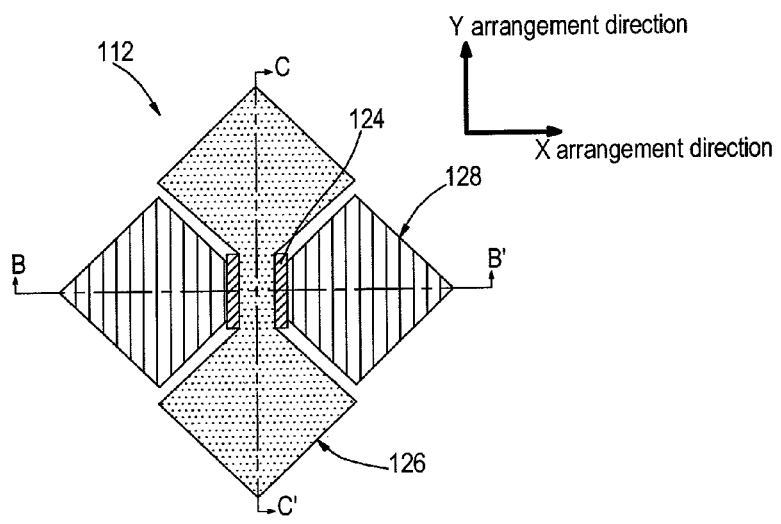
FIG. 3 is a plan schematic view of a touch sensor layer of a touch panel according to the first embodiment of the present invention, wherein a protective layer is omitted and is not shown.
Figure 4:
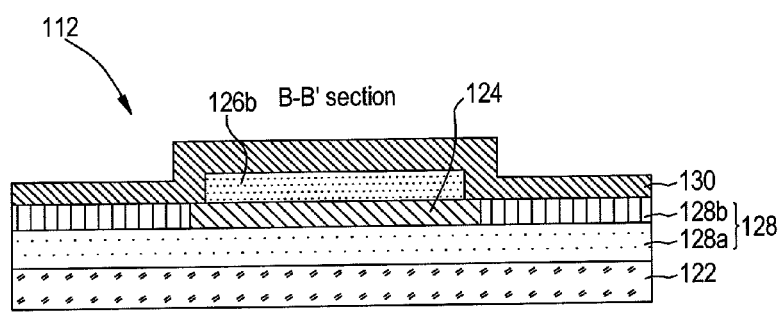
FIG. 4 is a cross-sectional schematic view of a touch sensor layer of a touch panel according to the first embodiment of the present invention, showing a section along sectional line B-B' of FIG. 3.
Figure 5:
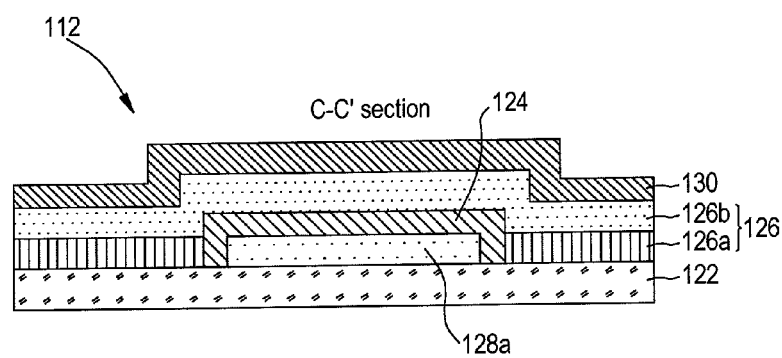
FIG. 5 is a cross-sectional schematic view of a touch sensor layer of a touch panel according to the first embodiment of the present invention, showing a section along sectional line C-C' of FIG. 3.

Referring to FIGS. 3, 4, 5, 6a and 6b, they depict a touch sensor layer 112 of a touch panel according to the first embodiment of the present invention. Referring to FIGS. 3, 4 and 5, the touch sensor layer 112 is constituted by transparently conductive wires which are interlaced longitudinally and transversely and separated from each other. The touch sensor layer 112 can disposed above a liquid crystal display module (not shown). The touch panel detects an inference of an electric field of the transparently conductive wires generated by a finger, and then reads a sensing signal generated from the longitudinal and transverse coordinates so as to determine a touch position.

The touch sensor layer 112 includes a first transparent electrode 128 (i.e., transparent electrode along Y arrangement direction) and a second transparent electrode 126 (i.e., transparent electrode along X arrangement direction), wherein the arrangement direction of the first transparent electrode 128 can be perpendicular to that of the second transparent electrode 126, and both of the first and second transparent electrodes 128, 126 include two transparent metallic patterns which are stacked and electrically connected to each other. The transparent metallic pattern is made of material being indium tin oxide (ITO) or indium zinc oxide (IZO). Generally, the transparent metallic pattern is formed by a film forming process and a patterning process.

Figure 6A:
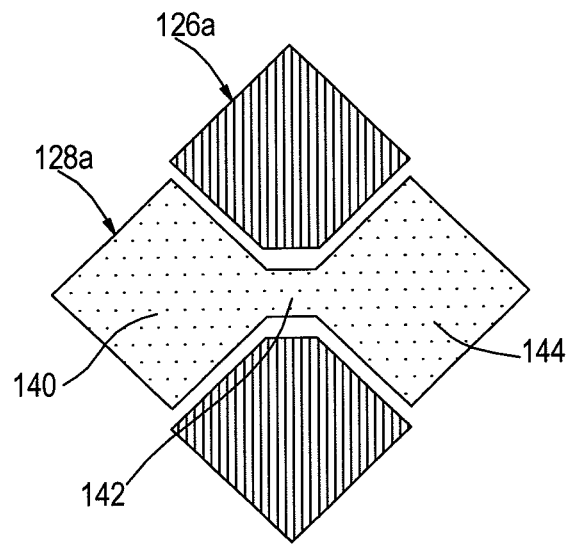
FIG. 6a is a plan schematic view of the first and third transparent metallic patterns according to the first embodiment of the present invention.
Figure 6B:
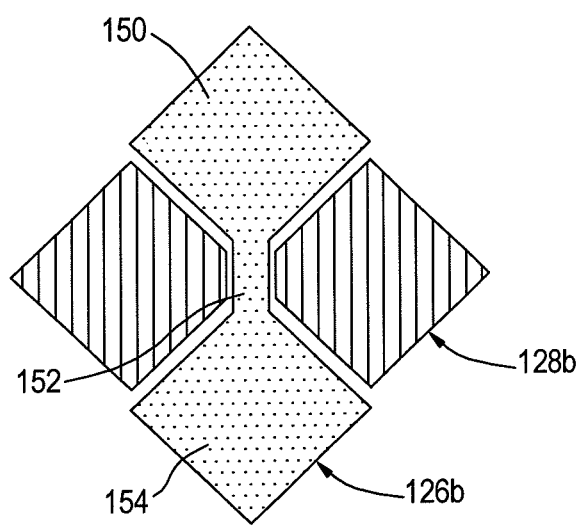
FIG. 6b is a plan schematic view of the second and fourth transparent metallic patterns according to the first embodiment of the present invention.

After the second transparent metallic pattern 128b and the fourth transparent metallic pattern 126b shown in FIG. 6b are stacked to the first transparent metallic pattern 128a and the third transparent metallic pattern 126a shown in FIG. 6a, the first and second transparent electrodes 128, 126 shown in FIG. 3 are formed accordingly. In other words, the first transparent electrode 128 includes a first transparent metallic pattern 128a (e.g., transparent metallic pattern along Y arrangement direction) and a second transparent metallic pattern 128b (e.g., floating transparent metallic pattern along Y arrangement direction), and the second transparent metallic pattern 128b is stacked and electrically connected to the first transparent metallic pattern 128a. The second transparent electrode 126 includes a third transparent metallic pattern 126a (e.g., transparent metallic pattern along X arrangement direction) and a fourth transparent metallic pattern 126b (e.g., floating transparent metallic pattern along X arrangement direction), and the fourth transparent metallic pattern 126b is stacked and electrically connected to the third transparent metallic pattern 126a. The first transparent metallic pattern 128a and the third transparent metallic pattern 126a are made of the same material in the same manufacturing process, and the second transparent metallic pattern 128b and the fourth transparent metallic pattern 126b are made of the same material in the same manufacturing process.

Referring FIGS. 6a and 6b again, the first transparent metallic pattern 128a includes a left portion 140, a crossing portion 142 and a right portion 144, and the crossing portion 142 is physically connected to the left portion 140 and the right portion 144. Also, the fourth transparent metallic pattern 126b includes a front portion 150, a crossing portion 152 and a rear portion 154, and the crossing portion 152 is physically connected to the front portion 150 and the rear portion 154.

Referring FIGS. 4 and 5 again, the first transparent metallic pattern 128a and the third transparent metallic pattern 126a are formed on a transparent substrate 122 respectively. An insulating layer 124 (which is island-shaped) is formed on the transparent substrate 122, whereby the crossing portion 142 of the first transparent metallic pattern 128a is electrically isolated from the crossing portion 152 of the fourth transparent metallic pattern 126b, and further the first transparent electrode 128 is electrically isolated from the second transparent electrode 126. A protective layer 130 covers the first transparent electrode 128, the second transparent electrode 126 and the insulating layer 124.

Figure 7:
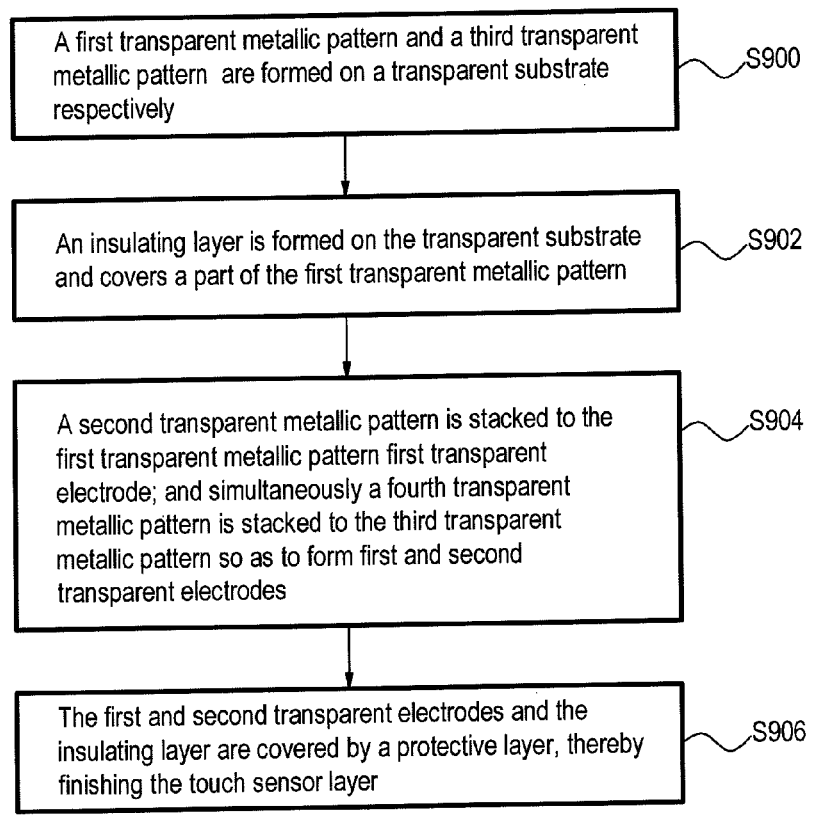
FIG. 7 is flow diagram of a method for manufacturing a touch sensor layer of a touch panel according to an embodiment of the present invention.

Referring to FIG. 7, it depicts a method for manufacturing a touch sensor layer 112 of the touch panel of the present invention. In step S900, a first transparent metallic pattern 128a and a third transparent metallic pattern 126a are formed on a transparent substrate 122 respectively. In step S902, an insulating layer 124 is formed on the transparent substrate 122 and covers a part of the first transparent metallic pattern 128a (e.g., the crossing portion 142 of the first transparent metallic pattern 128a). In step S904, a second transparent metallic pattern 128b is stacked and electrically connected to the first transparent metallic pattern 128a so as to form a first transparent electrode 128; and simultaneously a fourth transparent metallic pattern 126b is stacked and electrically connected to the third transparent metallic pattern 126a so as to form a second transparent electrode 126, wherein a part of the fourth transparent metallic pattern 126b (e.g., the crossing portion 152 of the fourth transparent metallic pattern 126b) covers the insulating layer 124, and the arrangement direction of the first transparent electrode 128 can be perpendicular to that of the second transparent electrode 126. In step S906, the first and second transparent electrodes 128, 126 and the insulating layer 124 are covered by a protective layer 130, thereby finishing the touch sensor layer 112, shown in FIGS. 3, 4, 5, 6a and 6b.

More detailed, the metal conductive wire, the first transparent electrode, the insulating layer, the second transparent electrode and the protective layer are five processes in this embodiment, and two photo masks of transparent electrodes in the five processes are used, i.e., the first transparent electrode 128 and the second transparent electrode 126 are designed in different photo masks of transparent electrodes respectively. When the first transparent metallic pattern 128a of the first transparent electrode 128 is designed, the third transparent metallic pattern 126a of the second transparent electrode 126 is designed simultaneously; and when the fourth transparent metallic pattern 126b of the second transparent electrode 126 is designed, the second transparent metallic pattern 128b of the first transparent electrode 128 is designed simultaneously. Thus, the first transparent metallic pattern 128a in the second process can be electrically connected to the second transparent metallic pattern 128b in the fourth process, and the third transparent metallic pattern 126a in the second process can be electrically connected to the fourth transparent metallic pattern 126b in the fourth process. The island-shaped insulating layer 124 is located between the first and second transparent electrodes 128, 126, and thus the first and second transparent electrodes 128, 126 are not electrically connected to each other.

Figure 8:
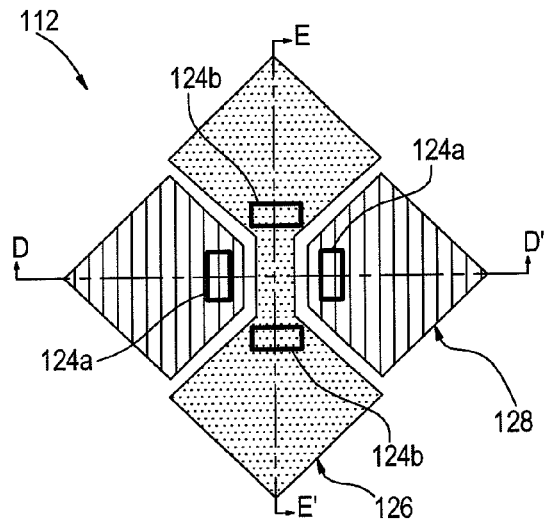
FIG. 8 is a plan schematic view of the second and fourth transparent metallic patterns according to another embodiment of the present invention.
Figure 9:
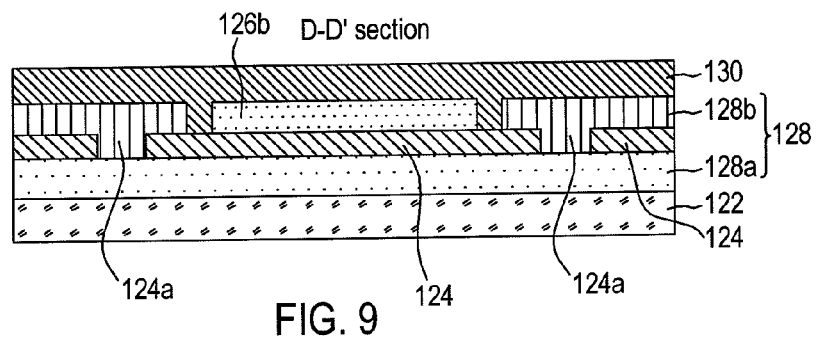
FIG. 9 is a cross-sectional schematic view of a touch sensor layer of a touch panel according to another embodiment of the present invention, showing a section along sectional line D-D' of FIG. 8.
Figure 10:
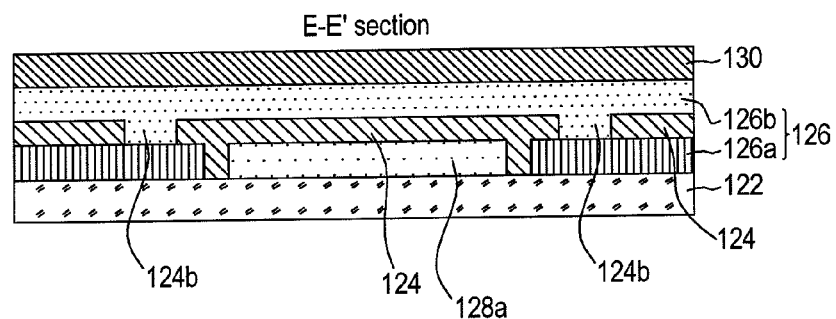
FIG. 10 is a cross-sectional schematic view of a touch sensor layer of a touch panel according to another embodiment of the present invention, showing a section along sectional line E-E' of FIG. 8.

FIG. 8 is a plan view of the second transparent metallic pattern 128b and the fourth transparent metallic pattern 126b according to another embodiment of the present invention. Referring to FIGS. 8 to 10, in another embodiment, an insulating layer 124 of a touch sensor layer 112 covers the whole first transparent metallic pattern 128a. The insulating layer 124 includes a plurality of first plated through holes 124a and second plated through holes 124b, the first plated through holes 124a are adapted to electrically connect the second transparent metallic pattern 128b to the first transparent metallic pattern 128a, and the second plated through holes 124b are adapted to electrically connect the fourth transparent metallic pattern 126b to the third transparent metallic pattern 126a.

Figure 11:
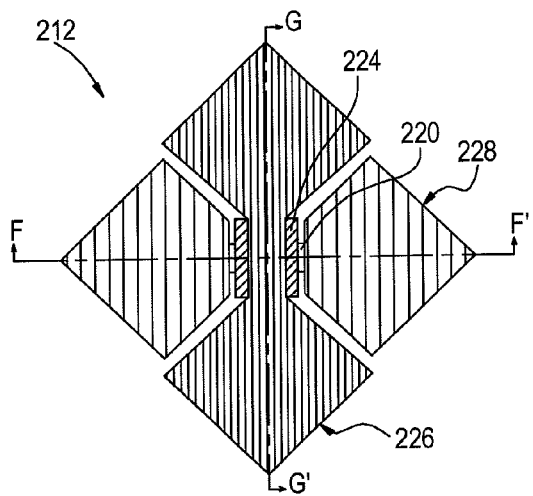
FIG. 11 is a plan schematic view of a touch sensor layer of a touch panel according to the second embodiment of the present invention, wherein a protective layer is omitted and is not shown.
Figure 12:
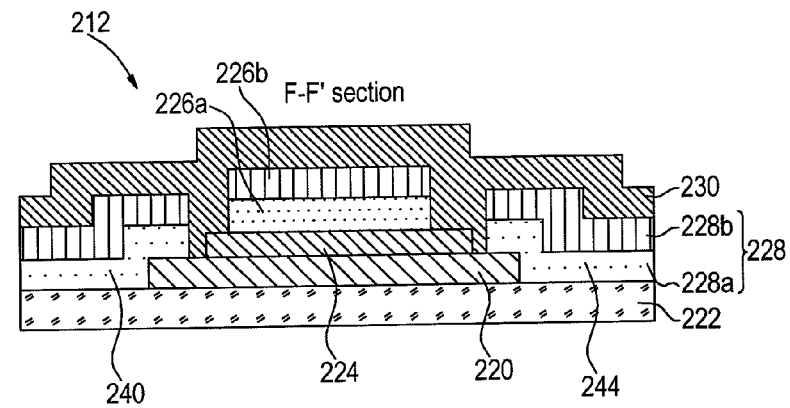
FIG. 12 is a cross-sectional schematic view of a touch sensor layer of a touch panel according to the second embodiment of the present invention, showing a section along sectional line F-F' of FIG. 11.
Figure 13:
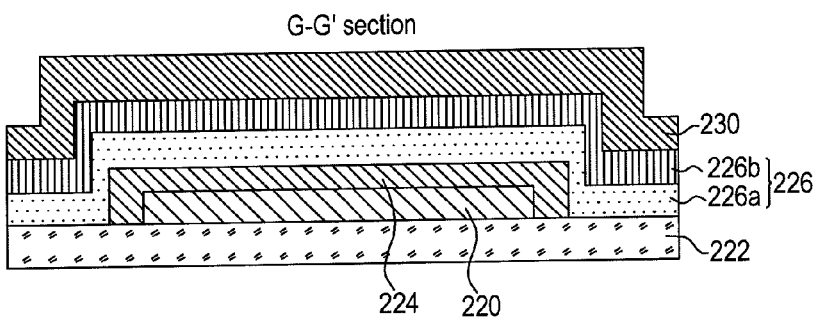
FIG. 13 is a cross-sectional schematic view of a touch sensor layer of a touch panel according to the second embodiment of the present invention, showing a section along sectional line G-G' of FIG. 11.

Referring to FIGS. 11, 12, 13, 14a and 14b, they depict a touch sensor layer 212 of a touch panel according to the second embodiment of the present invention. The touch sensor layer 212 in the second embodiment is substantially similar to the touch sensor layer 112 in the first embodiment, wherein the similar elements are designated with the same reference numerals. Referring to FIGS. 11, 12, 13, the difference between the touch sensor layers of the touch panels in the second and first embodiments is that: a metal connecting wire 220 is formed on the transparent substrate 222, wherein the first transparent metallic pattern 228a includes a left portion 240 and a right portion 244, and the metal connecting wire 220 is physically connected to the left portion 240 and the right portion 244 of the first transparent metallic pattern 228a (shown in FIG. 12). The metal connecting wire 220 can be made of non-transparent material.

Figure 14A:
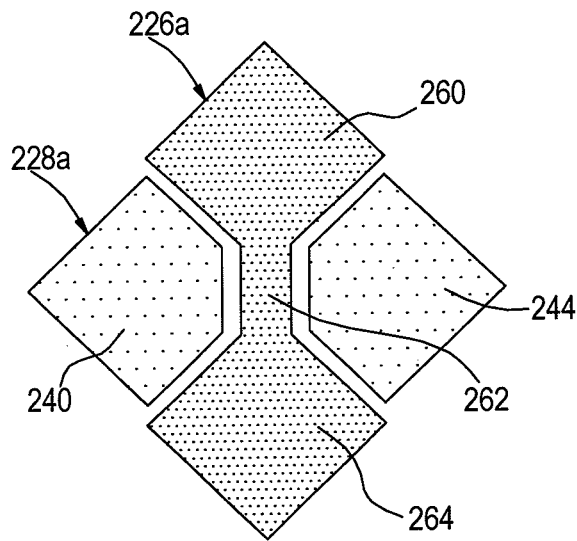
FIG. 14a is a plan schematic view of the first and third transparent metallic patterns according to the second embodiment of the present invention.
Figure 14B:
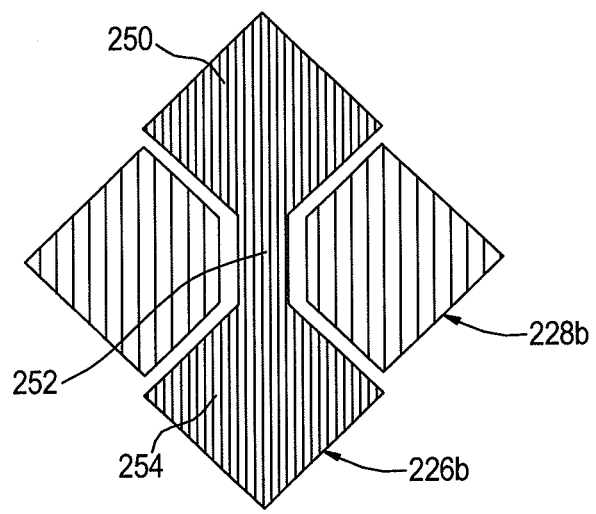
FIG. 14b is a plan schematic view of the second and fourth transparent metallic patterns according to the second embodiment of the present invention.

Similarly, after the second transparent metallic pattern 228b and the fourth transparent metallic pattern 226b shown in FIG. 14a are stacked to the first transparent metallic pattern 228a and the third transparent metallic pattern 226a shown in FIG. 14a, the first and second transparent electrodes 228, 226 shown in FIG. 11 are formed accordingly. In other words, the first transparent electrode 228 includes a first transparent metallic pattern 228a (e.g., transparent metallic pattern along Y arrangement direction) and a second transparent metallic pattern 228b (e.g., floating transparent metallic pattern along Y arrangement direction), and the second transparent metallic pattern 228b is stacked and electrically connected to the first transparent metallic pattern 228a. The second transparent electrode 226 includes a third transparent metallic pattern 226a (e.g., transparent metallic pattern along X arrangement direction) and a fourth transparent metallic pattern 226b (e.g., floating transparent metallic pattern along X arrangement direction), and the fourth transparent metallic pattern 226b is stacked and electrically connected to the third transparent metallic pattern 226a. The first transparent metallic pattern 228a and the third transparent metallic pattern 226a are made of the same material in the same manufacturing process, and the second transparent metallic pattern 228b and the fourth transparent metallic pattern 226b are made of the same material in the same manufacturing process.

Referring FIGS. 14a and 14b again, the third transparent metallic pattern 226a includes a front portion 260, a crossing portion 262 and a rear portion 264, and the crossing portion 262 is physically connected to the front portion 260 and the rear portion 264. Also, the fourth transparent metallic pattern 226b includes a front portion 250, a crossing portion 252 and a rear portion 254, and the crossing portion 252 is physically connected to the front portion 250 and the rear portion 254.

Referring FIGS. 12 and 13 again, the first transparent metallic pattern 228a and the third transparent metallic pattern 226a are formed on a transparent substrate 222 respectively. An insulating layer 224 (which is island-shaped) is formed on the transparent substrate 222, whereby the metal connecting wire 220 is electrically isolated from the crossing portion 262 of the third transparent metallic pattern 226a, and further the first transparent electrode 228 is electrically isolated from the second transparent electrode 226. A protective layer 230 covers the first transparent electrode 228, the second transparent electrode 226 and the insulating layer 224.

Figure 15:
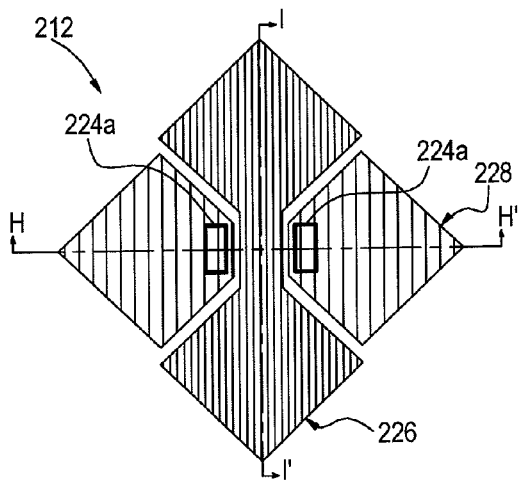
FIG. 15 is a plan schematic view of the second and fourth transparent metallic patterns according to another embodiment of the present invention.
Figure 16:
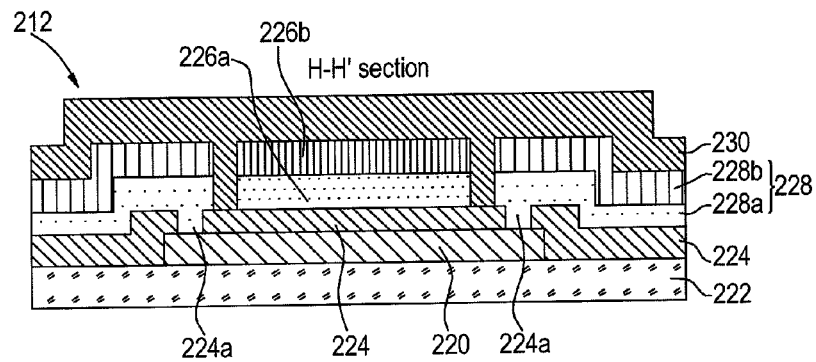
FIG. 16 is a cross-sectional schematic view of a touch sensor layer of a touch panel according to another embodiment of the present invention, showing a section along sectional line H-H' of FIG. 15.
Figure 17:
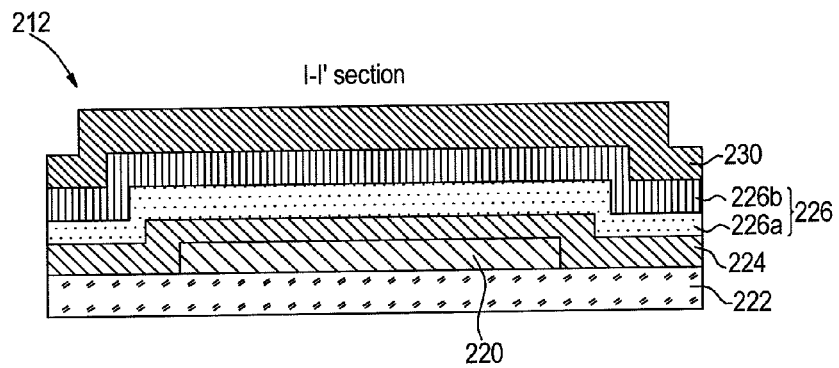
FIG. 17 is a cross-sectional schematic view of a touch sensor layer of a touch panel according to another embodiment of the present invention, showing a section along sectional line I-I' of FIG. 15.

FIG. 15 is a plan view of the second transparent metallic pattern 228b and the fourth transparent metallic pattern 226b according to another embodiment of the present invention. Referring to FIGS. 15 to 17, in another embodiment, an insulating layer 224 of a touch sensor layer 212 covers the whole metal connecting wire 220. The insulating layer 224 includes a plurality of plated through holes 224a, and the plated through holes 224a is adapted to electrically connect the first transparent metallic pattern 228a to electrically connect to the metal connecting wire 220.

Figure 18:
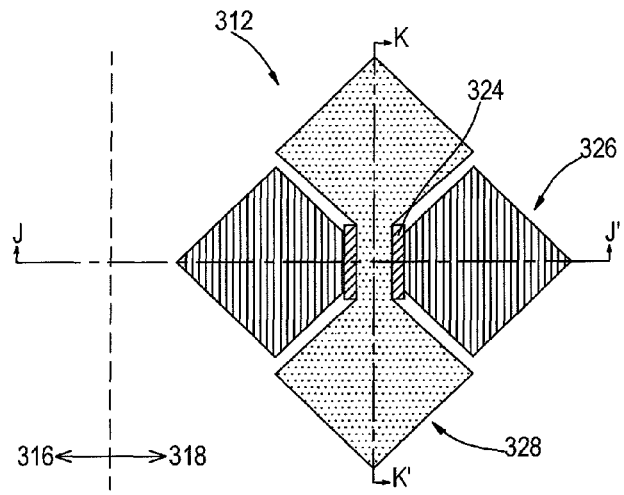
FIG. 18 is a plan schematic view of a touch sensor layer of a touch panel according to the third embodiment of the present invention, wherein a protective layer is omitted and is not shown.
Figure 19:
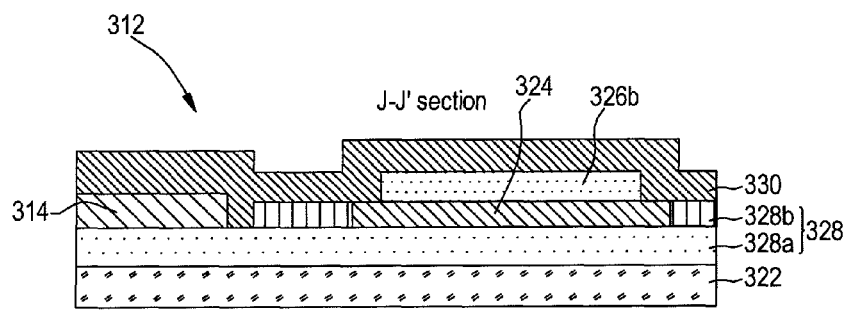
FIG. 19 is a cross-sectional schematic view of a touch sensor layer of a touch panel according to the third embodiment of the present invention, showing a section along sectional line J-J' of FIG. 18.
Figure 20:
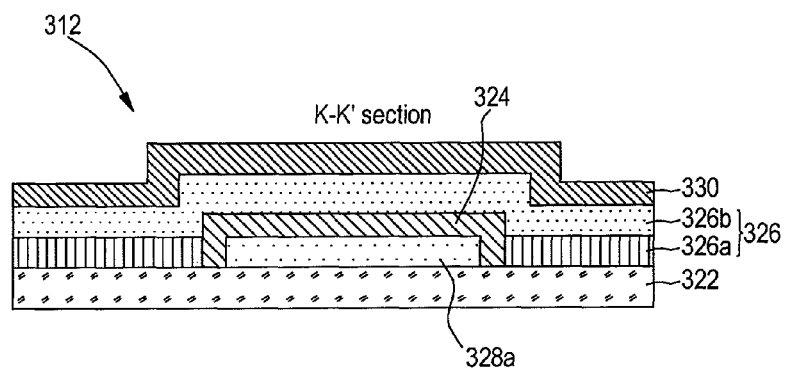
FIG. 20 is a cross-sectional schematic view of a touch sensor layer of a touch panel according to the third embodiment of the present invention, showing a section along sectional line K-K' of FIG. 18.

Referring to FIGS. 18 to 20, they depict a touch sensor layer 312 of a touch panel according to the third embodiment of the present invention. The touch sensor layer 312 in the third embodiment is substantially similar to the touch sensor layer 112 in the first embodiment, wherein the similar elements are designated with the same reference numerals. The first transparent metallic pattern 328a and the third transparent metallic pattern 326a are formed on a transparent substrate 322 respectively. An insulating layer 324 (which is island-shaped) is formed on the transparent substrate 322, whereby the first transparent electrode 328 is electrically isolated from the second transparent electrode 326. A protective layer 330 covers the first transparent electrode 328, the second transparent electrode 326 and the insulating layer 324.

The difference between the touch panels in the third and first embodiments is that: the touch sensor layer 312 further includes a metal conductive wire 314, wherein the metal conductive wire 314 and the first transparent metallic pattern 328a are made of different material by the same gray-level photo mask, and simultaneously the metal conductive wire 314 and the third transparent metallic pattern 326a are made of different material by the same gray-level photo mask. The metal conductive wire 314 can be made of non-transparent material. In this embodiment, the metal conductive wire 314 can be located in a non-display area 316, and the first transparent metallic pattern 328a and the third transparent metallic pattern 326a can be located in a display area 318.

More detailed, in this embodiment, a transparent metal layer is firstly formed, and a metal layer is formed. Then, a first transparent metallic pattern 328a, a third transparent metallic pattern 326a and a metal conductive wire 314 are manufactured by a gray-level photo mask. Then, an island-shaped insulating layer 324 is manufactured so as to prevent the first transparent electrode 328 from electrically connecting to the second transparent electrode 326. Finally, a second transparent metallic pattern 328b and a fourth transparent metallic pattern 326b are manufactured, wherein the second transparent metallic pattern 328b can be physically connected to the first transparent metallic pattern 328a, and the fourth transparent metallic pattern 326b can be physically connected to the third transparent metallic pattern 326a.

Figure 21:
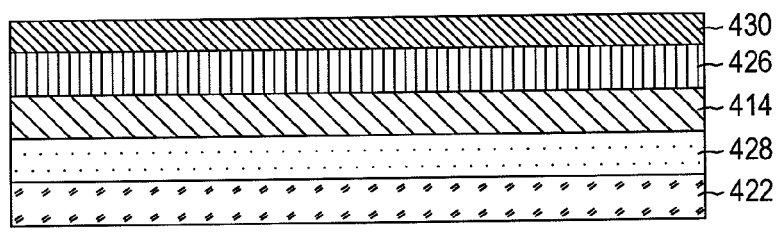
FIG. 21 is a cross-sectional schematic view of a touch sensor layer of a touch panel according to the fourth embodiment of the present invention.
Figure 22:
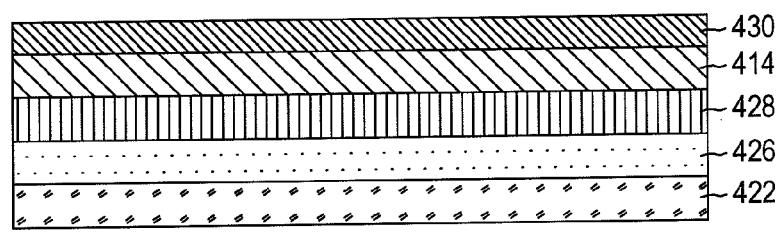
FIGS. 22 and 23 are a cross-sectional schematic views of a touch sensor layer of a touch panel according to another embodiment of the present invention.
Figure 23:
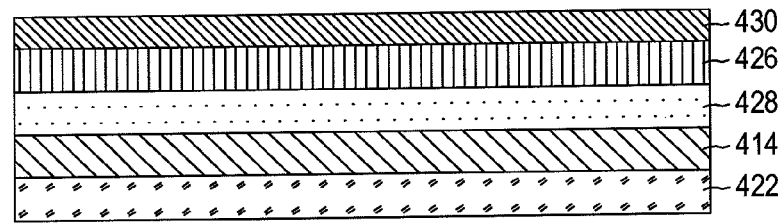

Referring to FIGS. 21 to 23, they depict a touch sensor layer 412 of a touch panel according to the third embodiment of the present invention. The touch sensor layer 412 further includes a metal conductive wire 414, a fifth transparent metallic pattern 428 and a sixth transparent metallic pattern 426. The metal conductive wire 414 can be located in a non-display area. In this embodiment, the fifth transparent metallic pattern 428 and the sixth transparent metallic pattern 426 are stacked to different sides of the metal conductive wire 414 respectively, thereby decreasing the resistance of the metal conductive wire 414. For example, the fifth transparent metallic pattern 428, the metal conductive wire 414, the sixth transparent metallic pattern 426 and the protective layer 430 are disposed on the transparent substrate 422 in order, shown in FIG. 21. In another embodiment, the fifth transparent metallic pattern 428 and the sixth transparent metallic pattern 426 are stacked to the same side of the metal conductive wire 414 in order, thereby decreasing the resistance of the metal conductive wire 414. For example, the sixth transparent metallic pattern 426, the fifth transparent metallic pattern 428, the metal conductive wire 414, and the protective layer 430 are disposed on the transparent substrate 422 in order, shown in FIG. 22; or, the metal conductive wire 414, the fifth transparent metallic pattern 428, the sixth transparent metallic pattern 426, and the protective layer 430 are disposed on the transparent substrate 422 in order, shown in FIG. 23. The fifth transparent metallic pattern 428 in the fourth embodiment and the first transparent metallic pattern 128a and the third transparent metallic pattern 126a in the first embodiment can be made of the same material in the same manufacturing process; and the sixth transparent metallic pattern 426 in the fourth embodiment and the second transparent metallic pattern 128b and the fourth transparent metallic pattern 126b in the first embodiment can be made of the same material in the same manufacturing process.

The present invention utilizes the structure of two layers of transparent metallic pattern to solve the problem that the film thickness of the amorphous ITO of the conventional touch panel cannot be too thick. Furthermore, the structure of two layers of transparent metallic patterns of the present invention can decrease the resistance of the whole transparent electrode. In addition, the present invention utilizes the film thickness of transparent metallic patterns to adjust the color shift of the touch panel.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A touch panel comprising:
a touch sensor layer comprising:
a first transparent electrode comprising a first transparent metallic pattern and a second transparent metallic pattern, wherein the second transparent metallic pattern is stacked and electrically connected to the first transparent metallic pattern; and
a second transparent electrode comprising a third transparent metallic pattern and a fourth transparent metallic pattern, wherein the fourth transparent metallic pattern is stacked and electrically connected to the third transparent metallic pattern;
wherein the first transparent metallic pattern and the third transparent metallic pattern are made of the same material in the same manufacturing process, and the second transparent metallic pattern and the fourth transparent metallic pattern are made of the same material in the same manufacturing process;
the first transparent electrode has a first arrangement direction, and the second transparent electrode has a second arrangement direction which is perpendicular to the first arrangement direction; and
the third transparent metallic pattern comprises a front portion, a crossing portion and a rear portion, and the crossing portion is physically connected to the front portion and the rear portion; and the fourth transparent metallic pattern comprises a front portion, a crossing portion and a rear portion, and the crossing portion is physically connected to the front portion and the rear portion.

2. The touch panel as claimed in claim 1, wherein the first to fourth transparent metallic patterns are made of material being indium tin oxide or indium zinc oxide.

3. The touch panel as claimed in claim 1, wherein the touch sensor layer further comprises a metal conductive wire, the metal conductive wire is made of different material from the material of the first transparent metallic pattern and the third transparent metallic pattern but is made by the same gray-level photo mask.

4. The touch panel as claimed in claim 1, wherein the touch sensor layer further comprises:

a transparent substrate, wherein the first transparent metallic pattern and the third transparent metallic pattern are formed on the transparent substrate respectively;

a metal connecting wire formed on the transparent substrate, wherein the first transparent metallic pattern comprises a left portion and a right portion, and the metal connecting wire is physically connected to the left portion and the right portion of the first transparent metallic pattern;

an insulating layer formed on the transparent substrate, whereby the metal connecting wire is electrically isolated from the crossing portion of the third transparent metallic pattern, and further the first transparent electrode is electrically isolated from the second transparent electrode; and a protective layer adapted to cover the first transparent electrode, the second transparent electrode and the insulating layer.

5. The touch panel as claimed in claim 4, wherein the insulating layer comprises a plurality of plated through holes, the plated through holes are adapted to electrically connect the first transparent metallic pattern to the metal connecting wire.

6. A touch panel comprising:
a touch sensor layer comprising:
a first transparent electrode comprising a first transparent metallic pattern and a second transparent metallic pattern, wherein the second transparent metallic pattern is stacked and electrically connected to the first transparent metallic pattern; and
a second transparent electrode comprising a third transparent metallic pattern and a fourth transparent metallic pattern, wherein the fourth transparent metallic pattern is stacked and electrically connected to the third transparent metallic pattern;
wherein the first transparent metallic pattern and the third transparent metallic pattern are made of the same material in the same manufacturing process, and the second transparent metallic pattern and the fourth transparent metallic pattern are made of the same material in the same manufacturing process;
the first transparent electrode has a first arrangement direction, and the second transparent electrode has a second arrangement direction which is perpendicular to the first arrangement direction; and
the touch sensor layer further comprises a metal conductive wire, a fifth transparent metallic pattern and a sixth transparent metallic pattern, and the fifth transparent metallic pattern and the sixth transparent metallic pattern are stacked to different sides of the metal conductive wire respectively.

7. The touch panel as claimed in claim 6, wherein the first to fourth transparent metallic patterns are made of material being indium tin oxide or indium zinc oxide.

8. The touch panel as claimed in claim 6, wherein the touch sensor layer further comprises a metal conductive wire, the metal conductive wire is made of different material from the material of the first transparent metallic pattern and the third transparent metallic pattern but are made by the same gray-level photo mask.

9. The touch panel as claimed in claim 6, wherein the first transparent metallic pattern comprises a left portion, a crossing portion and a right portion, and the crossing portion is physically connected to the left portion and the right portion; and the fourth transparent metallic pattern comprises a front portion, a crossing portion and a rear portion, and the crossing portion is physically connected to the front portion and the rear portion.

10. The touch panel as claimed in claim 9, wherein the touch sensor layer further comprises:
a transparent substrate, wherein the first transparent metallic pattern and the third transparent metallic pattern are formed on the transparent substrate respectively;
an insulating layer formed on the transparent substrate, whereby the crossing portion of the first transparent metallic pattern is electrically isolated from the crossing portion of the fourth transparent metallic pattern, and further the first transparent electrode is electrically isolated from the second transparent electrode; and
a protective layer adapted to cover the first transparent electrode, the second transparent electrode and the insulating layer.

11. The touch panel as claimed in claim 10, wherein the insulating layer comprises a plurality of first plated through holes and second plated through holes, the first plated through holes are adapted to electrically connect the second transparent metallic pattern to the first transparent metallic pattern, and the second plated through holes are adapted to electrically connect the fourth transparent metallic pattern to the third transparent metallic pattern.

12. The touch panel as claimed in claim 6, wherein the fifth transparent metallic pattern, the first transparent metallic pattern and the third transparent metallic pattern are made of the same material in the same manufacturing process; and the sixth transparent metallic pattern, the second transparent metallic pattern and the fourth transparent metallic pattern are made of the same material in the same manufacturing process.

13. A touch panel comprising:
a touch sensor layer comprising:
a first transparent electrode comprising a first transparent metallic pattern and a second transparent metallic pattern, wherein the second transparent metallic pattern is stacked and electrically connected to the first transparent metallic pattern; and
a second transparent electrode comprising a third transparent metallic pattern and a fourth transparent metallic pattern, wherein the fourth transparent metallic pattern is stacked and electrically connected to the third transparent metallic pattern;
wherein the first transparent metallic pattern and the third transparent metallic pattern are made of the same material in the same manufacturing process, and the second transparent metallic pattern and the fourth transparent metallic pattern are made of the same material in the same manufacturing process;
the first transparent electrode has a first arrangement direction, and the second transparent electrode has a second arrangement direction which is perpendicular to the first arrangement direction; and
the touch sensor layer further comprises a metal conductive wire, a fifth transparent metallic pattern and a sixth transparent metallic pattern, and the fifth transparent metallic pattern and the sixth transparent metallic pattern are stacked to the same side of the metal conductive wire in order.

14. The touch panel as claimed in claim 13, wherein the first to fourth transparent metallic patterns are made of material being indium tin oxide or indium zinc oxide.

15. The touch panel as claimed in claim 13, wherein the touch sensor layer further comprises a metal conductive wire, the metal conductive wire is made of different material from the material of the first transparent metallic pattern and the third transparent metallic pattern but are made by the same gray-level photo mask.

16. The touch panel as claimed in claim 13, wherein the first transparent metallic pattern comprises a left portion, a crossing portion and a right portion, and the crossing portion is physically connected to the left portion and the right portion; and the fourth transparent metallic pattern comprises a front portion, a crossing portion and a rear portion, and the crossing portion is physically connected to the front portion and the rear portion.

17. The touch panel as claimed in claim 16, wherein the touch sensor layer further comprises:
   a transparent substrate, wherein the first transparent metallic pattern and the third transparent metallic pattern are formed on the transparent substrate respectively;
   an insulating layer formed on the transparent substrate, whereby the crossing portion of the first transparent metallic pattern is electrically isolated from the crossing portion of the fourth transparent metallic pattern, and further the first transparent electrode is electrically isolated from the second transparent electrode; and
   a protective layer adapted to cover the first transparent electrode, the second transparent electrode and the insulating layer.

18. The touch panel as claimed in claim 17, wherein the insulating layer comprises a plurality of first plated through holes and second plated through holes, the first plated through holes are adapted to electrically connect the second transparent metallic pattern to the first transparent metallic pattern, and the second plated through holes are adapted to electrically connect the fourth transparent metallic pattern to the third transparent metallic pattern.

19. The touch panel as claimed in claim 13, wherein the fifth transparent metallic pattern, the first transparent metallic pattern and the third transparent metallic pattern are made of the same material in the same manufacturing process; and the sixth transparent metallic pattern, the second transparent metallic pattern and the fourth transparent metallic pattern are made of the same material in the same manufacturing process.

* * * * *